United States Patent [19]

Kamagata et al.

[11] Patent Number: 4,593,069

[45] Date of Patent: Jun. 3, 1986

[54] EPOXY RESIN COMPOSITION

[75] Inventors: Kazuo Kamagata, Hatoyama; Toshiaki Yamada; Shunichi Kawata, both of Tsurugashima; Takashi Mizui, Kawagoe, all of Japan

[73] Assignees: Shikoku Chemicals Corp., Kagawa; Shikoku Finechemicals Corp., Tokyo, both of Japan

[21] Appl. No.: 747,234

[22] Filed: Jun. 21, 1985

[30] Foreign Application Priority Data

Jun. 23, 1984 [JP] Japan ................... 59-129457
Jun. 27, 1984 [JP] Japan ................... 59-133559
Jun. 27, 1984 [JP] Japan ................... 59-133560

[51] Int. Cl.$^4$ ............................................ C08G 59/56
[52] U.S. Cl. ................... 525/113; 525/504; 528/93; 528/104; 528/118; 528/123; 528/361; 528/407
[58] Field of Search ............... 525/113, 504; 528/93, 528/104, 118, 123, 361, 407

[56] References Cited

U.S. PATENT DOCUMENTS

| | | | |
|---|---|---|---|
| 3,242,131 | 3/1966 | Peerman | 528/118 X |
| 3,265,664 | 8/1966 | Fulmer et al. | 528/118 |
| 4,021,403 | 5/1977 | Fujiwara et al. | 525/113 X |
| 4,555,532 | 11/1985 | Tanaka et al. | 528/118 X |

Primary Examiner—Earl Nielsen
Attorney, Agent, or Firm—Sherman and Shalloway

[57] ABSTRACT

An epoxy resin composition comprising an epoxy resin, either 2-vinyl-4,6-diamino-s-triazine or 2-vinyl-4,6-diamino-s-triazine/isocyanuric acid adduct, and at least one compound selected from dicyandiamide, polyvinyl-p-phenol and specific imidazole compounds. The composition is useful, for example, in inks, insulating paints and adhesives for printed circuit base boards and in copper-clad laminated boards.

7 Claims, No Drawings

EPOXY RESIN COMPOSITION

BACKGROUND OF THE INVENTION

1. Field of the Invention

This invention relates to an epoxy resin composition which has the ability to prevent migration of gold, silver, copper, etc. used as circuits in electronic component parts and printed base boards, and possesses excellent heat resistance, chemical resistance, moisture resistance, adhesion and insulation. It is useful, for example, for the production of sealing materials for electronic component parts, inks, insulating paints and adhesives for printed circuit base boards, and copper-clad laminated boards.

2. Description of the Prior Art

Epoxy resins have found widespread use in various industrial fields because they cure with, for example, aliphatic amines, aromatic amines, tertiary amines, polyamide resins or acid anhydrides to give resins having excellent heat resistance, electrical insulation and adhesion. Especially, it is known that blending of a certain imidazole compound, a kind of tertiary amine, with an epoxy resin can give a one-package epoxy resin composition having good workability or handlability and being capable of giving a cured product having excellent heat resistance (see U.S. Pat. No. 4,205,156).

With the recent tendency to the smaller sizes, lighter weights and higher densities of electronic appliances and component parts, epoxy resins for sealing are required to have high insulating property and heat resistance.

Inks and insulating paints for printed circuit base boards and copper-clad laminated boards have been required likewise to have high insulation and heat resistance in fine and multilayered printed circuits. Furthermore, the prevention of migration of silver or copper constituting the circuits has also been rigorously required. Various resins have been developed and marketed in an attempt to meet these requirements, but none have proved to be entirely satisfactory in workability or handlability or in other properties. For example, these resins are not entirely satisfactory in regard to curing conditions and pot lives, or have large shrinkage on curing or low adhesion.

SUMMARY OF THE INVENTION

Extensive investigations of the present inventors conducted in view of the foregoing state of the art have now led to the discovery of a novel epoxy resin composition which has satisfactory heat resistance, electrical insulation, adhesion, moisture resistance, chemical resistance and the ability to prevent migration, can be formulated as a one-package system, and can cure at relatively low temperatures.

Thus, according to this invention, there is provided an epoxy resin composition comprising an epoxy resin, either 2-vinyl-4,6-diamino-s-triazine of the following formula

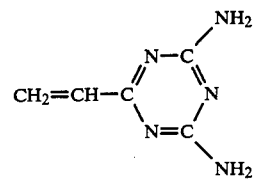

or 2-vinyl-4,6-diamino-s-triazine isocyanuric acid adduct of the following formula

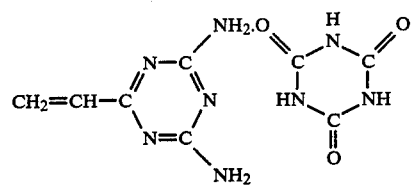

and at least one compound selected from the group consisting of polyvinyl-p-phenol of the following formula

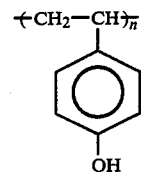

wherein n is 25 to 70, dicyandiamide and imidazole compounds represented by the formula

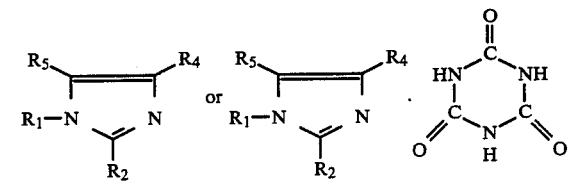

wherein $R_1$ represents a hydrogen atom or a cyanoethyl group or 4,6-diaminotriazinyl(-2')ethyl group, $R_2$ represents a methyl, ethyl, undecyl, heptadecyl or phenyl group, $R_4$ represents a hydrogen atom or a methyl, hydroxymethyl, benzyl or 2-ethyl-5-methylimidazolyl(-4)-methyl group, and $R_5$ represents a hydrogen atom or a methyl or hydroxymethyl group.

DETAILED DESCRIPTION OF THE INVENTION

The characteristic feature of the present invention is that a composition having the aforesaid excellent properties can be obtained from an epoxy resin and 2-vinyl-4,6-diamino-s-triazine or 2-vinyl-4,6-diamino-s-triazine isocyanuric acid adduct as essential ingredients and at least one third ingredient selected from the group consisting of certain imidazole compounds, dicyandiamide and polyvinyl-p-phenol.

2-Vinyl-4,6-diamino-s-triazine can be synthesized, for example, by reacting biguanide with acryloyl chloride (J. Am. Chem. Soc., 80, 988 (1958)), reacting dicyandiamide with beta-dimethylaminopropionitrile (French Pat. No. 1563255), or heating 1,2-di(4',6'-diamino-s- triazinyl-(2)')-cyclobutane under reduced pressure (Japanese Patent Publication No. 35068/1971).

2-Vinyl-4,6-diamino-s-triazine/isocyanuric acid adduct can be synthesized by heating the 2-vinyl-4,6-diamino-s-triazine prepared as above and isocyanuric acid in water in the presence of a polymerization inhibitor.

Examples of epoxy resins suitably used in this invention include polyglycidyl ethers of polyhydric phenols such as a diglycidyl ether of bisphenol A or a diglycidyl ether of bisphenol F, epoxidized phenolnovolac resins, alicyclic epoxy resins and brominated products of these epoxy resins.

Suitable imidazole compounds for use in this invention are compounds represented by the following formula

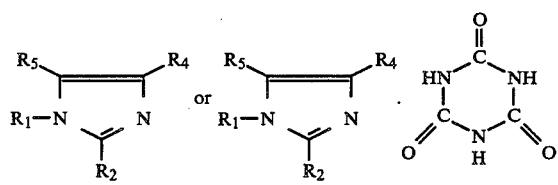

wherein $R_1$ represents a hydrogen atom or a cyanoethyl group or 4,6-diaminotriazinyl(-2')ethyl group, $R_2$ represents a methyl, ethyl, undecyl, heptadecyl or phenyl group, $R_4$ represents a hydrogen atom or a methyl, hydroxymethyl, benzyl or 2-ethyl-5-methylimidazolyl(-4)-methyl group, and $R_5$ represents a hydrogen atom or a methyl or hydroxymethyl group.

Examples of the imidazole compounds include 2,4-diamino-6-(2'methylimidazolyl-(1)')ethyl-s-triazine, 2,4-diamino-6-(2'-methylimidazolyl-(1)')ethyl-s-triazine/isocyanuric acid adduct, 2-phenyl-4,5-dihydroxymethylimidazole, 2-phenyl-4-methyl-5-hydroxymethylimidazole, 2-phenyl-4-benzyl-5-hydroxymethylimidazole, and 4,4'-methylenebis-(2-ethyl-5-methylimidazole). When these imidazole compounds are blended with liquid epoxy resins, one-package compositions can be obtained which have excellent storage stability and can be cured at relatively low temperatures of about 150° C.

Other examples of the imidazole compound used in this invention are 2-methyl-imidazole, 2-ethyl-4-methylimidazole, 2-phenylimidazole, 2-undecylimidazole, 2-heptadecylimidazole, 2-phenyl-4-methylimidazole, 1-cyanoethyl-2-methylimidazole, 1-cyanoethyl-2-ethyl-4-methylimidazole, and 1-cyanoethyl-2-phenylimidazole. A group of these compounds are preferably added to epoxy resins immediately before use because blends of these with liquid epoxy resins have poor storage stability.

The curing mechanism of the composition of this invention is not certain, but the present inventors theorize as follows. The epoxy resin polymerizes by the action of the imidazole compound, polyvinyl-p-phenol or dicyandiamide. Simultaneously, the double bonds of 2-vinyl-4,6-diamino-s-triazine or 2-vinyl-4,6-diamino-s-triazine/isocyanuric acid adduct are cleaved to induce radical polymerization. Furthermore, the two amino groups on the triazine ring react with the epoxy resin. It is presumed that these three reactions take place almost simultaneously to give a cured product having excellent heat resistance and electrical properties.

Now, the invention will be described below with reference to inks and insulating paints for printed circuit base boards and copper-clad laminated boards for the production of which the epoxy resin composition of this invention is useful.

The inks and insulating paints for printed circuit base boards are used for the following purposes.

In so-called thick film hybrid integrated circuit base boards obtained by forming the desired circuit including a silver-, platinum- or palladium-type conductor containing a glass frit as a binder, a resistor, a condenser etc. on an insulating base board such as a ceramic or glass board by screen printing, and firing the resulting board at high temperatures or printed circuit base boards obtained by forming the desired circuit by etching a copper foil on a paper, phenolic resin or glass-epoxy resin laminated board, the required circuit is normally exposed flat on the surface, and is therefore liable to be corroded by the adhesion of corrosive substances or moisture contained in the atmosphere.

In order to prevent such an accident by corrosion and to increase the reliability of the circuit, it is the general practice to form a protective coating, called a permanent resist, on the circuit by screen printing, etc.

The protective coating used in this case is required to have various properties such as electrical insulation, moisture resistance, chemical resistance, adhesion and hardness. Moreover, since the circuits in the aforesaid thick film hybrid integrated circuit base boards or printed circuit base boards tend to be minute and complex, plating of nickel, gold, copper, etc. or soldering might cause short-circuiting. It is known that an attempt is made to prevent this type of accident by coating a protective paint called a resist ink by screen printing, etc. on those parts which do not require plating, curing the coated film, and thereafter, plating the unprotected parts. The protective paint is required to have the functions of ink such as viscosity, roping property and thixotropic property suitable for screen printing, etc. Discoloration and migration of a conductor circuit of silver or copper which occur upon application of a voltage under high temperature and high pressure environmental conditions have become a problem as printed circuit base boards and the like have been required to have smaller sizes, higher densities and higher reliability so as to provide small-sized and light-weight electronic appliances having high reliability.

Except a triazine resin and a bismaleimide-triazine resin either singly or in combination, scarcely any resins have been found to be useful for protective paints.

Known conventional protective paints having the aforesaid properties and functions include, for example, paints of the firable glass type, those of the heat-curable epoxy resin, phenol resin, melamine resin, epoxy-melamine and silicone resin types, and paints of the ultraviolet-curable epoxy-acrylate resin type. Except the paints of the glass type, these protective paints have only an insufficient ability to prevent discoloration and migration of silver or copper conductors. The aforesaid triazine resin-type and biamalimide-triazine resin-type protective paints are not satisfactory with regard to curing conditions and pot lives.

It has now been found in accordance with this invention that the aforesaid defects can be eliminated by uniformly dispersing 10 to 40 parts by weight, per 100 parts by weight of the epoxy resin, of polyvinyl-p-phenol having an average degree of polymerization of 25 to 70 and a particle diameter of 200 to 300 mesh and 20 to 100 parts by weight, per 100 parts by weight of the epoxy resin, of a filler in an epoxy resin composition comprising the epoxy resin, the imidazole compound, and either 2-vinyl-4,6-diamino-s-triazine or 2-vinyl-4,6-diamino-s-triazine/isocyanuric acid adduct.

The resulting composition is a one-package epoxy resin composition having good storage stability and can be used as a protective paint for thick film hybrid integrated circuit base boards, printed circuit base boards, and the like or an insulating layer for multiple wirings.

As required, a coloring pigment may be added to the composition of this invention. It is also possible to add a thixotropy-imparting agent, a defoamer or a surface flowability adjusting agent in order to impart screen printing adaptability.

The addition of polyvinyl-p-phenol can accelerate the curing of the composition and increase its adhesion to a base board.

With formulations having unsatisfactory storage stability, the composition of this invention may be used as a two-package system. Specifically, a package (A) is prepared by uniformly mixing the epoxy resin with 2-vinyl-4,6-diamino-s-triazine or 2-vinyl-4,6-diamino-s-triazine/isocyanuric acid adduct and a filler, and a package (B) is prepared by dissolving polyvinyl-p-phenol and the imidazole compound in a suitable amount of an organic solvent such as butyl carbitol acetate. The packages (A) and (B) are mixed immediately before use.

Copper-clad glass-epoxy resin laminated boards have long been used in the field of industrial machines and appliances. Since, the spacings in printed circuits have recently become narrower and an increased number of components of smaller sizes have been mounted on the circuits, the base boards have been stringently required to have excellent heat resistance, electrical properties at high temperatures, and migration preventing property. Polymide resins or maleimide resins are used as resins for copper-clad laminates requiring these properties. These resins have excellent heat resistance and electrical properties, but solvents therefore are limited. For example, an expensive and high boiling (meaning the difficulty of solvent removal) solvent such as N-methylpyrrolidone has to be used, and curing temperatures of at least 200° C. are required.

A copper-clad laminated board having excellent heat resistance and electrical properties and the excellent ability to present copper migration can be produced by dissolving a composition comprising the epoxy resin, 2-vinyl-4,6-diamino-s-triazine, the imidazole compound and dicyandiamide in methyl ethyl ketone or methyl Cellosolve, impregnating the solution in a substrate, removing the solvent, and bonding copper foils to the substrate under heat and pressure.

The following examples illustrate the present invention more specifically.

EXAMPLES 1 AND 2 AND COMPARATIVE EXAMPLE 1

Two parts by weight of 2,4-diamino-6-(2'-methylimidazolyl-(1))-ethyl-s-triazine or a curing agent was added to 100 parts by weight of an epoxy resin (EPIKOTE 828 (Yuka Shell), and further 20 parts by weight of 2-vinyl-4,6-diamino-s-triazine or 2-vinyl-4,6-diamino-s-triazine/isocyanuric acid adduct was added.

For comparison, the triazine compound (20 parts) was not added (Comparative Example 1).

Each of the compositions was cured under heat, and the properties of the cured product were measured. The results are shown in Table 1.

TABLE 1

|  | Example 1 | Example 2 | Comparative Example 1 |
|---|---|---|---|
| Formulation (parts by weight) | | | |
| Epoxy resin | 100 | 100 | 100 |
| Imidazole compound | 2 | 2 | 2 |
| 2-Vinyl-4,6-diamino-s-triazine | 20 | — | — |
| 2-Vinyl-4,6-diamino-s-triazine/isocyanuric acid adduct | — | 20 | — |
| Curing conditions | 100° C./4 hr + 180° C./2 hr | | |
| Glass transition point (°C.) (TMA method) | 153 | 150 | 84 |
| Volume resistivity (ohms-cm) | | | |
| 25° C. | $3 \times 10^{15}$ | $6 \times 10^{15}$ | $4 \times 10^{15}$ |
| 100° C. | $2 \times 10^{13}$ | $4 \times 10^{13}$ | $9 \times 10^{12}$ |
| 150° C. | $2 \times 10^{12}$ | $3 \times 10^{11}$ | $2 \times 10^{10}$ |
| Dielectric constant 30 Hz | | | |
| 25° C. | 3.50 | 3.49 | 3.56 |
| 100° C. | 3.74 | 3.98 | 4.43 |
| 150° C. | 5.05 | 5.05 | 30.80 |

EXAMPLES 3 TO 12 AND COMPARATIVE EXAMPLES 2 TO 4

In these examples, one-package inks for printed circuit base boards were prepared using 2-vinyl-4,6-diamino-s-triazine (or 2-vinyl-4,6-diamino-s-triazine/isocyanuric acid adduct) in accordance with the formulations indicated in Table 2.

The gel time and storage stability of each of the ink compositions were tested, and the results are given in Table 3.

Each of the ink compositions was coated to a thickness of 20 microns by screen printing, and heating it at 150° C. for 15 minutes to form a cured film. Various properties of the cured film were measured, and the results are shown in Table 4.

TABLE 2

| Composition (parts by weight) | Example 3 | 4 | 5 | 6 | 7 | 8 | 9 | 10 | 11 | 12 | Comparative Example 2 | 3 | 4 |
|---|---|---|---|---|---|---|---|---|---|---|---|---|---|
| 1. Epoxy resin: | | | | | | | | | | | | | |
| Epikote #828 (Yuka Shell) | 100 | 100 | 100 | | | 100 | 100 | 100 | | | | | |
| YD128 (Toto Chemical Co.) | | | | 70 | 70 | | | | 70 | 70 | 70 | 70 | 70 |
| EOCN-1025 (Nihon Kayaku Co.) | | | | 30 | 30 | | | | 30 | 30 | 30 | 30 | 30 |
| 2. Curing agent | | | | | | | | | | | | | |
| 2,4-Diamino-6-(2'methylimidazolyl-(1'))-ethyl-s-triazine/isocyanuric acid adduct | | | | | 7 | | | | | 5 | | 7 | |
| 2,4-Diamino-6-(2'-methylimidazolyl-(1'))-ethyl-s-triazine | 1 | 1 | 1.5 | 6 | | 1 | 1 | 1 | 5 | | 5 | | 6 |
| Dicyandiamide | | | | | | | | | | | | | 2 |
| 3. 2-Vinyl-4,6-diamino-s-triazine | 10 | 10 | 15 | 10 | 10 | | | | | | | | |

TABLE 2-continued

| Composition (parts by weight) | Example 3 | 4 | 5 | 6 | 7 | 8 | 9 | 10 | 11 | 12 | Comparative Example 2 | 3 | 4 |
|---|---|---|---|---|---|---|---|---|---|---|---|---|---|
| 2-Vinyl-4,6-diamino-s-triazine/ isocyanuric acid adduct | | | | | | 10 | 10 | 20 | 10 | 10 | | | |
| 4. Polyvinyl-p-phenol (Resin M, Maruzen Oil Co., Ltd.) | 20 | 10 | 10 | 10 | 10 | 20 | 10 | 10 | 10 | 10 | | | |
| 5. Filler: | | | | | | | | | | | | | |
| Talc | 20 | 20 | 20 | | | 20 | 20 | 20 | | | | | |
| Barium sulfate | 60 | 60 | 60 | 60 | 30 | 60 | 60 | 60 | 60 | 30 | 30 | 30 | 60 |
| Mica | | | | 20 | 10 | | | | 20 | 10 | 10 | 10 | 20 |
| 6. Dispersant: | | | | | | | | | | | | | |
| Disparon NS-30 (Kusumoto Chemical Co.) | 2 | 2 | 2 | | | 2 | 2 | 2 | | | | | |
| Disparon NS-30 #230 (Kusumoto Chemical Co.) | | | | 0.3 | 0.3 | | | | 0.3 | 0.3 | 0.3 | 0.3 | 0.3 |
| Disparon NS-30 #1900 (Kusumoto Chemical Co.) | | | | | | | | | | | | 0.3 | |
| Disparon NS-30 #1930 (Kusumoto Chemical Co.) | | | | 0.3 | 0.3 | | | | 0.3 | 0.3 | 0.3 | | 0.3 |
| 7. Flow adjusting agent: | | | | | | | | | | | | | |
| Aerosil #300 (Japan Aerosil Co.) | | | | 2 | 2 | | | | 2 | 2 | 2 | 2 | 2 |
| 8. Flow adjusting aid: | | | | | | | | | | | | | |
| Butyl carbitol acetate | 20 | 10 | 10 | | | 20 | 10 | 10 | | | | | |
| Cellosolve acetate | | | | 5 | | | | | 5 | | 5 | 5 | |
| Xylene | | | | | 5 | | | | | 5 | | | 5 |
| 9. Defoamer: | | | | | | | | | | | | | |
| KS603 (Shin-etsu Chemical Co., Ltd) | 0.5 | 0.5 | 0.5 | | | 0.5 | 0.5 | 0.5 | | | | | |

TABLE 3

| Example (Ex.) or Comparative Example (CEx.) | Gel time (seconds) (*1) | Storage stability (*2) 25° C. (months) | 40° C. (days) |
|---|---|---|---|
| Ex. 3 | 95 | 2 | 10 |
| Ex. 4 | 95 | 2 | 10 |
| Ex. 5 | 105 | 2 | 10 |
| Ex. 6 | 70 | 1 | 6 |
| Ex. 7 | 50 | 1 | 6 |
| Ex. 8 | 95 | 2 | 10 |
| Ex. 9 | 95 | 2 | 10 |
| Ex. 10 | 90 | 2 | 10 |
| Ex. 11 | 80 | 1 | 6 |
| Ex. 12 | 60 | 1 | 6 |
| CEx. 2 | 80 | 2 | 20 |
| CEx. 3 | 75 | 1 | 10 |
| CEx. 4 | 80 | 1 | 6 |

(*1): Measured by the hot plate method. About 0.3 g of the composition was placed on a hot plate kept at 150° C., and spread thin by a metallic spatula, and the time which elapsed until no roping occurred between the spatula and the composition was determined and defined as the gel time.
(*2): The time which elapsed until the viscosity of the composition measured by a B-type rotary viscometer reached twice that in the initial stage was measured, and defined as the storage stability.

TABLE 4

| Ex. or CEx. | Resistance to migration(*3) Cu conductor circuit on XPC substrate(*4) | Ag conductor circuit on XPC substrate(*5) | Ag conductor circuit on ceramic substrate(*6) | Electrical insulation (ohm-cm)(*7) | Heat resistance to solder(*8) | Chemical resistance(*9) 10% $H_2SO_4$ | 10% NaOH | Hardness (H)(*10) |
|---|---|---|---|---|---|---|---|---|
| Ex. 3 | no change | no change | no change | $>10^4$ | no change | no change | no change | >7 |
| Ex. 4 | " | " | " | " | " | no change | no change | " |
| Ex. 5 | " | " | " | " | " | no change | no change | " |
| Ex. 6 | " | " | " | " | " | no change | no change | " |
| Ex. 7 | " | " | " | " | " | no change | no change | " |
| Ex. 8 | " | " | " | " | " | no change | no change | " |
| Ex. 9 | " | " | " | " | " | no change | no change | " |
| Ex. 10 | " | " | " | " | " | no change | no change | " |
| Ex. 11 | " | " | " | " | " | no change | no change | " |
| Ex. 12 | " | " | " | " | " | no change | no change | " |
| CEx. 2 | Cathode side circuit discolored 100 hours later | Anode side circuit discolored 24 hours later, and the discolored part disappeared 50 hours later | Anode side circuit discolored 200 hours later | $>10^4$ | no change | peeling occurred | no change | >7 |
| CEx. 3 | Cathode side circuit disco- | Anode side circuit discolored 24 | Anode side circuit discolored 200 hours | " | " | peeling occurred | no change | " |

TABLE 4-continued

| | lored 100 hours later | hours later, and the discolored part disappeared 50 hours later | later | | | | |
|---|---|---|---|---|---|---|---|
| CEx. 4 | Cathode side circuit discolored 100 hours later | Anode side circuit discolored 24 hours later, and the discolored part disappeared 50 hours later | Anode side circuit discolored 200 hours later | " | " | peeling occurred | no change | " |

(*3) Migration in the test specimen was examined every predetermined time at a temperature of 60° C., a humidity of 95% and an applied voltage (DC) of 30 V.
(*4) A copper clad XPC laminate in accordance with the NEMA standards was used. The copper foil was etched away to form a comb-like electrode circuit with a conductor line in width of 0.5 mm and an interconductor spacing of 0.3 mm. The composition was screen-printed on the circuit and cured under heat. The resulting test specimen was left to stand for 500 hours under the aforesaid conditions.
(*5) By screen printing, a comb-like electrode circuit with a conductive line in width of 0.5 mm and an interconductor spacing of 0.3 mm was formed from a silver powder-phenolic resin paste on an XPC laminate in accordance with the NEMA standards, and baked at 150° C. for 30 minutes. Then, the composition was screen-printed on the circuit, and cured under heat. The resulting test specimen was left to stand for 100 hours under the conditions indicated in (*3) above.
(*6) By screen printing, a comb-like electrode circuit with a conductor line in width of 1 mm and an interconductor spacing of 0.5 mm was formed from a silver-palladium powder glass paste on a ceramic substrate, and fired at 700° C. for 2 hours. The composition was screen-printed on the circuit and cured under heat. The resulting test specimen was left to stand for 5 hours under the conditions indicated in (*3) above.
(*7) The test specimen was prepared by screen-printing the composition on an aluminum plate to form a protective film in accordance with JIS-C-2103.
(*8) The test specimen prepared by the method of (*4) above was dipped for 30 seconds in a molten solder bath at 260° C., and then observed for blisters, peeling, etc. on the surface of the coated film. Then, the specimen was subjected to a crosscut peeling test in accordance with JIS-D-0202.
(*9) The test specimen prepared by the method of (*4) above was immersed for 120 hours in a 10% sulfuric acid solution or a 10% sodium hydroxide solution, and then a change in the coated film was observed.
(*10) The pencil hardness of the test specimen prepared by the method (*4) was measured in accordance with JIS-D-0202.

EXAMPLES 13 TO 15 AND COMPARATIVE EXAMPLE 5

Two-package inks for printed circuit base boards were prepared in accordance with the formulations indicated in Table 5.

The mixing ratio of package A and package B should be determined according to the desired performance. In these examples, the weight ratio of package A to package B was adjusted to 100:13.6.

For comparison, a commercial ultraviolet-curable composition (Solder Resist UR3000, a trade name for a product of Sanwa Chemical Industry Co., Ltd.) was used (Comparative Example 5).

TABLE 5

| Package | Composition (parts by weight) | Example 13 | Example 14 | Example 15 | Comparative Example 5 |
|---|---|---|---|---|---|
| A | 1. Epoxy resin (EPIKOTE #828) | 100 | 100 | 100 | Commercial ultraviolet-curable composition (Solder Resist UR3000) |
| | 2. 2-Vinyl-4,6-diamino-s-triazine | 15 | 15 | 15 | |
| | 3. Fillers: Talc | 20 | 20 | 20 | |
| | Barium sulfate | 60 | 60 | 60 | |
| | 4. Dispersant: Disparon NS-30 | 2 | 2 | 2 | |
| B | 5. Flow adjusting aid: butyl-carbitol acetate | 20 | 10 | 10 | |
| | 6. Polyvinyl-p-phenol (Maruzen Resin M) | 20 | 10 | 10 | |
| | 7. Curing agent | | | | |
| | 2,4-Diamino-6-(2'-methylimidazolyl-(1'))-ethyl-s-triazine | 7.5 | — | — | |
| | 2,4-Diamino-6-(2'-methylimidazolyl-(1'))-ethyl-s-triazine/isocyanuric acid adduct | — | 7.5 | — | |
| | 2-Ethyl-4-methyl-imidazole | — | — | 3 | |
| | 8. Defoamer KS603 (Shin-etsu Chemical) | 0.5 | 0.5 | 0.5 | |

TABLE 6

| Example (Ex.) or Comparative Example (CEx.) | Gel time (*1) (seconds) | Storage stability (*2) 5° C. (months) | 25° C. (days) | 40° C. (days) |
|---|---|---|---|---|
| Ex. 13 | 25 | 4 (*b) | 4 (*c) | 2 (*c) |
| Ex. 14 | 35 | 4 (*b) | 5 (*c) | 2 (*c) |
| Ex. 15 | 20 | 4 (*b) | 1 (*c) | 2 (*c) |
| CEx. 5 | 20 (*a) | 3 | — | — |

(*a): Three 80 W/cm ozoneless high-pressure mercury lamps were used for irradiation. The oven passing rate was 4 m/min.
(*b): Packages A and B were stored independently.
(*c): The pot life of a mixture of predetermined amounts of packages A and B.

Each of the compositions was coated to a film thickness of 20 microns by screen printing, and then cured at The properties of the ink compositions were tested and the results are shown in Table 6. In Table 6, the gel time and the storage stability (pot life) were measured in the same way as indicated in the footnotes to Table 3.

150° C. for 15 minutes. The ultraviolet-curable ink of Comparative Example 5 was cured by using three 80 W/cm ozoneless high-pressure mercury lamps (speed 4 m/min.).

The properties of the cured products were tested in the same way as indicated in the footnotes to Table 4. The results are summarized in Table 7.

TABLE 7

| Ex. or CEx. | Cu conductor circuit on XPC substrate(*4) | Ag conductor circuit on XPC substrate(*5) | Ag conductor circuit on ceramic substrate(*6) | Electrical insulation (ohm-cm)(*7) | Heat resistance to solder(*8) | Chemical resistance(*9) 10% $H_2SO_4$ | Chemical resistance(*9) 10% NaOH | Hardness (H)(*10) |
|---|---|---|---|---|---|---|---|---|
| Ex. 13 | no change | no change | no change | >$10^4$ | no change | no change | no change | >7 |
| Ex. 14 | " | " | " | " | " | no change | no change | " |
| Ex. 15 | " | " | " | " | " | no change | no change | " |
| CEx. 5 | Cathode side circuit discolored 100 hours later | Anode side circuit discolored 24 hours later, and the discolored part disappeared 50 hours later | Anode side circuit discolored 200 hours later | " | " | no change peeled | no change peeled | >3 |

EXAMPLES 16 AND 17 AND COMPARATIVE EXAMPLE 6

In each run, a composition was prepred in accordance with the formulation shown in Table 8.

TABLE 8

| Ingredients (parts by weight) | Example 16 | Example 17 | Comparative Example 6 |
|---|---|---|---|
| Epomic R301-M80 (Mitsui Petrochemical Industries (*d) | 37.5 | | 100 |
| Epikote DX2480B70 (Yuka Shell) (*e) | | 100 | |
| Epikote #828 (Yuka Shell) | 20 | 10 | |
| 2-Vinyl-4,6-diamino-s-triazine (*f) | 10 | 8 | |
| Dicyandiamide | | 6.4 | 6.4 |
| 2-Ethyl-4-methylimidazole | 0.7 | 0.8 | 0.8 |
| Methyl ethyl ketone | 71.2 | 40 | |
| Methyl Cellosolve | | 53.1 | 62.8 |

(*d): Epomic R301-M80 is a 80% by weight methyl ethyl ketone solution of an epi-bis type solid epoxy resin.
(*e): Epikote DX248-B70 is a 70% by weight methyl ethyl ketone solution of brominated epoxy resin (bromine content 24-26%).
(*f): 2-Vinyl-4,6-diamino-s-triazine was kneaded in advance with Epikote #828 on a three-roll mill and dispersed until the particle diameter became less than 5 microns.

The composition in solution was impregnated with glass woven cloths (0.18 mm thick) treated with aminosilane, and dried in the air to remove the solvent.

The composition was pre-cured at 90° C. for 3 minutes (for Examples 16 and 17) or 150° C. for 3 minutes (for Comparative Example 6) to prepare prepregs.

Eight such prepregs were laid one on top of another, and copper foils (35 microns) were placed over the top and bottom of the assembly. The entire assembly was compressed at 170° C. and 50 to 60 kg/cm² for 90 minutes, and then heat-treated at 200° C. for 60 minutes to cure the epoxy composition.

The properties of the resulting copper-clad laminated board were measured, and the results are shown in Table 9.

TABLE 9

| Properties | Example 16 | Example 17 | Comparative Example 6 |
|---|---|---|---|
| Glass transition point (°C.) (*11) | 185 | 180 | 150 |
| Solder heat resistance (seconds) (*12) | >180 | >180 | 30 |
| Peel strength of the copper foils (kg/cm) (*13) | 1.8 | 1.7 | 1.8 |

TABLE 9-continued

| Properties | Example 16 | Example 17 | Comparative Example 6 |
|---|---|---|---|
| Flame retardance (seconds) (*14) | burned | 6 | burned |

(*11): The glass transition point of the copper-clad laminated board was measured by the TBA method after the copper foils were removed from it by etching and a thin piece was cut out from the board.
(*12): A square piece with each side measuring 25 mm was prepared from the copper-clad laminated board, and caused to float on a solder bath at 260° C. It was observed for changes such as blisters.
(*13): The peel strength of the copper foils is the strength measured when the copper foil was peeled perpendicularly from a 10 mm width test piece of the copper-clad laminated board at a speed of 5 mm/min.
(*14): Measured by the vertical method of UL Standards 94.

What is claimed is:

1. An epoxy resin composition comprising an epoxy resin, either 2-vinyl-4,6-diamino-s-triazine or 2-vinyl-4,6-diamino-s-triazine/isocyanuric acid adduct, and at least one compound selected from the group consisting of dicyandiamide, polyvinyl-p-phenol, and imidazole compounds represented by the following formula

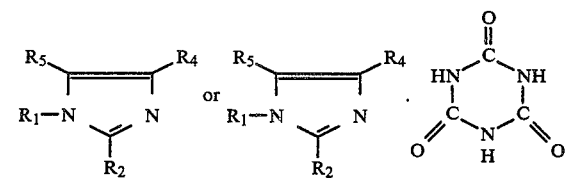

wherein $R_1$ represents a hydrogen atom or a cyanoethyl group or 4,6-diaminotriazinyl(-2')ethyl group, $R_2$ represents a methyl, ethyl, undecyl, heptadecyl or phenyl group, $R_4$ represents a hydrogen atom or a methyl, hydroxymethyl, benzyl or 2-ethyl-5-methylimidazolyl(-4)-methyl group, and $R_5$ represents a hydrogen atom or a methyl or hydroxymethyl group.

2. An epoxy resin composition according to claim 1 which comprises 100 parts by weight of the epoxy resin, 5 to 50 parts by weight of either 2-vinyl-4,6-diamino-s-triazine or 2-vinyl-4,6-diamino-s-triazine/isocyanuric acid adduct, and at least one compound selected from the group consisting of 1 to 20 parts by weight of dicyandiamide, 10 to 40 parts by weight of polyvinyl-p-phenol, and 0.025 to 10 parts by weight of the imidazole compounds.

3. An epoxy resin composition according to claim 1 which comprises the epoxy resin, 2-vinyl-4,6-diamino-s-triazine and the imidazole compound.

4. An epoxy resin composition according to claim 1 which comprises the epoxy resin, 2-vinyl-4,6-diamino-s-triazine, the imidazole compound and dicyandiamide.

5. An epoxy resin composition according to claim 1 which comprises the epoxy resin, 2-vinyl-4,6-diamino-s-triazine, the imidazole compound and polyvinyl-p-phenol.

6. An epoxy resin composition according to claim 1 which comprises the epoxy resin, the 2-vinyl-4,6-diamino-s-triazine/isocyanuric acid adduct and the imidazole compound.

7. An epoxy resin composition according to claim 1 which comprises the epoxy resin, the 2-vinyl-4,6-diamino-s-triazine/isocyanuric acid adduct, the imidazole compound and polyvinyl-p-phenol.

* * * * *